US010312456B2

(12) United States Patent
Yersin et al.

(10) Patent No.: US 10,312,456 B2
(45) Date of Patent: Jun. 4, 2019

(54) ORGANIC MOLECULES FOR OLEDS AND OTHER OPTOELECTRONIC DEVICES

(71) Applicant: CYNORA GMBH, Bruchsal (DE)

(72) Inventors: Hartmut Yersin, Sinzing (DE); Alexander Hupfer, Abendsberg (DE)

(73) Assignee: CYNORA GMBH, Bruchsal (DE)

( * ) Notice: Subject to any disclaimer, the term of this patent is extended or adjusted under 35 U.S.C. 154(b) by 1154 days.

(21) Appl. No.: 14/367,666

(22) PCT Filed: Dec. 11, 2012

(86) PCT No.: PCT/EP2012/075112
§ 371 (c)(1),
(2) Date: Jun. 20, 2014

(87) PCT Pub. No.: WO2013/092313
PCT Pub. Date: Jun. 27, 2013

(65) Prior Publication Data
US 2015/0155500 A1    Jun. 4, 2015

(30) Foreign Application Priority Data
Dec. 22, 2011 (DE) .................. 10 2011 089 687

(51) Int. Cl.
C09K 11/06      (2006.01)
H01L 51/00      (2006.01)
H01L 51/50      (2006.01)

(52) U.S. Cl.
CPC .......... *H01L 51/0072* (2013.01); *C09K 11/06* (2013.01); *H01L 51/0058* (2013.01); *H01L 51/0071* (2013.01); *H01L 51/5024* (2013.01); *C09K 2211/1011* (2013.01); *C09K 2211/1029* (2013.01); *C09K 2211/1033* (2013.01); *C09K 2211/1096* (2013.01); *H01L 51/006* (2013.01); *H01L 51/5016* (2013.01); *H01L 51/5028* (2013.01); *Y02E 10/549* (2013.01); *Y02P 70/521* (2015.11)

(58) Field of Classification Search
CPC combination set(s) only.
See application file for complete search history.

(56) References Cited

U.S. PATENT DOCUMENTS

| | | | | | |
|---|---|---|---|---|---|
| 4,281,294 | A | * | 7/1981 | Volkin | H01S 3/022 372/40 |
| 4,344,855 | A | * | 8/1982 | Schafer | C07C 263/18 252/182.21 |
| 6,420,056 | B1 | | 7/2002 | Chondroudis et al. | |
| 7,416,791 | B1 | | 8/2008 | Carlson et al. | |
| 9,024,026 | B2 | * | 5/2015 | Yersin | C07D 471/04 546/10 |
| 9,266,906 | B2 | * | 2/2016 | Baumann | H01L 51/0091 |
| 9,537,117 | B2 | * | 1/2017 | Yersin | C07F 9/587 |
| 2002/0008233 | A1 | | 1/2002 | Forrest et al. | |
| 2005/0142380 | A1 | | 6/2005 | Chin et al. | |
| 2005/0153165 | A1 | | 7/2005 | Grushin et al. | |
| 2005/0214576 | A1 | | 9/2005 | Lamansky et al. | |
| 2006/0058494 | A1 | * | 3/2006 | Busing | C08G 61/02 528/86 |
| 2010/0117521 | A1 | | 5/2010 | Yersin et al. | |
| 2012/0248968 | A1 | | 10/2012 | Ogiwara et al. | |

FOREIGN PATENT DOCUMENTS

| | | | |
|---|---|---|---|
| CN | | 1280394 A | 1/2001 |
| CN | | 1423512 A | 6/2003 |
| CN | | 1469692 A | 1/2004 |
| DE | | 102007031261 | 1/2009 |
| DE | | 102008033563 A1 | 1/2010 |
| JP | | 2004199875 A | 7/2004 |
| JP | | 2005170708 A | 6/2005 |
| JP | | 2010506411 A | 2/2010 |
| JP | | 2013253121 A | 12/2013 |
| JP | | WO2013011955 A1 | 2/2015 |
| WO | | 2011089163 A1 | 7/2011 |
| WO | | 2011147522 A1 | 12/2011 |
| WO | PCT/EP2011/060834 | | 1/2012 |
| WO | WO 2012010650 A1 * | | 1/2012 ........... C07D 471/04 |
| WO | WO 2013007707 A1 * | | 1/2013 ......... H01L 51/0091 |

OTHER PUBLICATIONS

Hung et al. Phys. Chem. Chem. Phys. 2008, 10, 5822-5825.*
Mendonsa et al. J. Lumin. 2002, 97, 19-33.*
Nakagawa et al. "Electroluminescence Based on Thermally Activated Delayed Fluorescence Generated by a Spirobifluorene Donor-Acceptor Structure" Chem. Commun. 2012, 48, 9580-9582 (Year: 2012).*
Ku et al. "Spiro-Configured Bipolar Host Materials for Highly Efficient Electrophosphorescent Devices" Chem. Asian J. 2012, 7, 133-142 (pub. Oct. 13, 2011). (Year: 2011).*
Wu et al. "Highly bright blue organic light-emitting devices using spirobifluorene-cored conjugated compounds" Appl. Phys. Lett. 2002, 81, 577-579. (Year: 2002).*
Wong et al. "Harvesting of Organic Triplet Emissions is Metal Diynes and Polyynes of Group 10-12 Transition Elements Containing the Conjugation-Interrupting Diphenylfluorene Unit" Macromolecules 2004, 37, 4496-4504. (Year: 2004).*
S. Baluschev et al., "Two Pathways for Photon Upconversion in Model Organic Compound Systems," Journal of Applied Physics, Jan. 2007, pp. 1-4, vol. 101, No. 2.

(Continued)

*Primary Examiner* — Amanda L Aguirre
(74) *Attorney, Agent, or Firm* — Ryan, Mason & Lewis, LLP

(57) ABSTRACT

The invention relates to a composition having an organic emitter molecule, which has a $\Delta E(S_1-T_1)$ value between the lowest excited singlet state ($S_1$) and the triplet state thereunder of less than 3000 $cm^{-1}$ and an atom or molecule for reducing the intersystem crossing time constant of the organic molecule.

8 Claims, 12 Drawing Sheets

(56) References Cited

OTHER PUBLICATIONS

A. Endo et al., "Efficient Up-Conversion of Triplet Excitons into a Singlet State and its Application for Organic Light Emitting Diodes," Applied Physics Letters, Jan. 2011, pp. 1-3, vol. 98.

Y.-T. Lee et al., "Solid-State Highly Fluorescent Diphenylaminospirobifluorenylfumaronitrile Red Emitters for Non-Doped Organic Light-Emitting Diodes," Chemical Communications, Jan. 2008, pp. 217-219.

I. Gryczyński et al., "Thermal Deactivation of the Lowest Singlet and Triplet Excited States of Acridine Dyes in Poly(Vinyl Alcohol) Films," Journal of Photochemistry, Dec. 1985, pp. 265-272, vol. 31, Nos. 2-3.

X. Xing et al., "An Alternative Way to Use the Triplet Energy of Fluorescent Dyes in Organic Light-Emitting Devices via an External Iodide," Organic Electronics, Jan. 2012, pp. 195-198, vol. 13, No. 1.

Hartmut Yersin, "Triplet Emitters for OLED Applications. Mechanisms of Exciton Trapping and Control of Emission Properties," Topics in Current Chemistry, 2004, pp. 1-26, vol. 241.

H. Yersin et al., "Triplet Emitters for Organic Light-Emitting Diodes: Basic Properties," Highly Efficient OLEDs with Phosphorescent Materials, Chapter 1, Jan. 2008, 97 pages.

C.W. Tang et al., "Organic Electroluminescent Diodes," Applied Physics Letters, Sep. 1987, pp. 913-915, vol. 51, No. 12.

T. Sajoto et al., "Temperature Dependence of Blue Phosphorescent Cyclometalated Ir(III) Complexes," Journal of American Chemical Society (JACS), Apr. 2009, pp. 9813-9822, vol. 131.

C.A. Zuniga et al., "Approaches to Solution-Processed Multilayer Organic Light-Emitting Diodes Based on Cross-Linking," Chemistry of Materials Review, 2011, pp. 658-681, vol. 23.

M.A. Baldo et al., "Excitonic Singlet-Triplet Ratio in a Semiconducting Organic Thin Film," The American Physical Society, Physical Review B, Nov. 1999, pp. 422-428, vol. 60, No. 20.

Von Ernst Lippert, "Dipolmoment and Elektronenstruktur von Angeregten Molekülen," Z. Naturforsche, 1957, pp. 541-545, vol. 10a.

Chih-Long Chiang et al., "Red-Emitting Fluorines as Efficient Emitting Hosts for Non-Doped Organic Red-Light-emitting Diodes", Advanced Functional Materials, Feb. 28, 2005, vol. 15 No. 2.

Hartmut Yersin, "Organometallic Triplet Emitters for OLED Applications. Controlling of Emission Properties by Chemical Variation," Proceedings of SPIE, Organic Light-Emitting Materials and Devices VII, Aug. 2003, pp. 124-132, vol. 5214.

A. Endo et al., "Thermally Activated Delayed Fluorescence from Sn4+-Porphyrin Complexes and Their Application to Organic Light Emitting Diodes—A Novel Mechanism for Electroluminescence," Advanced Materials, Dec. 2009, pp. 4802-4806, vol. 21, No. 47.

S. Baluschev, "Two Pathways for Photon Upconversion in Model Organic Compound Systems," Journal of Applied Physics, Jan. 2007, pp. 023101-1-023101-4, vol. 101, No. 2.

A. Endo et al., "Efficient Up-Conversion of Triplet Excitons into a Singlet State and its Application for Organic Light Emitting Diodes," Applied Physics Letter, Feb. 2011, pp. 083302-1-083302-3, vol. 98, No. 8.

Y.-T. Lee et al., "Solid-State Highly Fluorescent Diphenylaminospirobifluorenylfumaronitrile Red Emitters for Non-Doped Organic Light-Emitting Diodes," Chemical Communications, 2008, pp. 217-219.

I. Gryczynski et al., "Thermal Deactivation of the Lowest Singlet and Triplet Excited States of Acridine Dyes in Poly(Vinyl Alcohol) Films," Journal of Photochemistry, Dec. 1985, pp. 265-272, vol. 31, No. 2-3.

X. Xing et al., "An Alternative Way to Use the Triplet Energy of Fluorescent Dyes in Organic Light-Emitting Devices Via an External Iodide," Organic Electronics, 2012, pp. 195-198, vol. 13.

H. Yersin et al., "Triplet Emitters for Organic Light-Emitting Diodes: Basic Properties," Wiley-VCH Verlag GmbH & Co., Jan. 2008, pp. 1-97.

Wen-Yi Hung et al: "An ambipolar host material provides highly efficient saturated red PhOLEDs possessing simple device structures", Physical Chemistry Chemical Physics; Bd. 10, Nr. 38, 1. Jan. 2008, Seite 5822, XP055142437,ISSN: 1463-9076, DOI: 10.1039/b811356b.

\* cited by examiner

Acridine yellow

Acridine orange

ORGANIC MOLECULES FOR OLEDS AND OTHER OPTOELECTRONIC DEVICES

FIELD OF INVENTION

The present invention relates to the use of specific organic dyes without metal centers as emitters in OLEDs (organic light-emitting diodes) and in other optoelectronic devices.

BACKGROUND OF THE INVENTION

Currently, it is apparent that OLED assemblies are already now of economic significance, since mass production is expected shortly. Such OLEDs consist predominantly of organic layers which can also be manufactured flexibly and inexpensively. OLED components can be configured with large areas as illumination bodies, but also in small form as pixels for displays.

Compared to conventional technologies, for instance liquid-crystal displays (LCDs), plasma displays or cathode ray tubes (CRTs), OLEDs have numerous advantages, such as a low operating voltage of a few volts, a thin structure of only a few hundred nm, high-efficiency self-illuminating pixels, high contrast and good resolution, and the possibility of representing all colors. In addition, in an OLED, light is produced directly on application of electrical voltage, rather than merely being modulated.

A review of the function of OLEDs can be found, for example, in H. Yersin, Top. Curr. Chem. 2004, 241, 1 and H. Yersin, "Highly Efficient OLEDs with Phosphorescent Materials"; Wiley-VCH, Weinheim, Germany, 2008.

Since the first reports regarding OLEDS (see, for example, Tang et al., Appl. Phys. Lett. 1987, 51, 913), these devices have been developed further particularly with regard to the emitter materials used, and particular interest has been attracted in the last few years by so-called triplet emitters or other phosphorescent emitters.

OLEDs are generally implemented in layer structures. For better understanding, FIG. 1 shows a basic structure of an OLED. Owing to the application of external voltage to a transparent indium tin oxide (ITO) anode and a thin metal cathode, the anode injects positive holes, and the cathode negative electrons. These differently charged charge carriers pass through intermediate layers, which may also consist of hole or electron blocking layers not shown here, into the emission layer. The oppositely charged charge carriers meet therein at or close to doped emitter molecules, and recombine. The emitter molecules are generally incorporated into matrices consisting of small molecules or polymer matrices (in, for example, 2 to 10% by weight), the matrix materials being selected so as also to enable hole and electron transport. The recombination gives rise to excitons (=excited states) which transfer their excess energy to the respective electro-luminescent compound. This compound can then be converted to a particular electronic excited state which is then converted very substantially and with substantial avoidance of radiationless deactivation processes to the corresponding ground state by emission of light.

With a few exceptions, the electronic excited state, which can also be formed by energy transfer from a suitable precursor exciton, is either a singlet or triplet state. Since the two states are generally occupied in a ratio of 1:3 on the basis of spin statistics, the result is that the emission from the singlet state, which is referred to as fluorescence, according to the present state of the art, leads to maximum emission of only 25% of the excitons produced. In contrast, triplet emission, which is referred to as phosphorescence, exploits and converts all excitons and emits them as light (triplet harvesting), such that the internal quantum yield in this case can reach the value of 100%, provided that the additionally excited singlet state which is above the triplet state in terms of energy relaxes fully to the triplet state (intersystem crossing, ISC), and radiationless competing processes remain insignificant. Thus, triplet emitters, according to the current state of the art, are more efficient electro-luminophores and have better suitability than purely organic singlet emitters for ensuring a high light yield in an organic light-emitting diode.

In the triplet emitters suitable for triplet harvesting transition metal complexes are generally used in which the metal is selected from the third period of the transition metals. This predominantly involves very expensive noble metals such as iridium, platinum or else gold. (See also H. Yersin, Top. Curr. Chem. 2004, 241, 1 and M. A. Baldo, D. F. O'Brien, M. E. Thompson, S. R. Forrest, Phys. Rev. B 1999, 60, 14422).

The phosphorescent organometallic triplet emitters known to date in OLEDs, however, have a disadvantage, which is that these complexes are frequently more chemically reactive in electronically excited states than in the base states. Responsible for this are generally metal-ligand bond breakages. Therefore, the long-term stability of these emitter materials is inadequate in many cases. (T. Sajoto, P. I. Djurovich, A. B. Tamayo, J. Oxgaard, W. A. Goddard III, M. E. Thompson; J. Am. Chem. Soc. 2009, 131, 9813). As a result, efforts are being made to develop emitter molecules without metal centers and with high emission quantum yield, wherein the emitter molecules shall furthermore also convert all singlet and triplet excitons into light. OLEDs using such emitters should exhibit a high efficiency, and additionally enable a longer lifetime of the optoelectronic device.

In summary, the prior art can be described such that the triplet emitters which are efficient per se and are known to date have the disadvantages that
  expensive noble metal molecules have to be used and that
  these emitters formed on the basis of organometallic complexes have only inadequate long-term stability in many cases.

BRIEF DESCRIPTION OF THE DRAWINGS

Exemplary embodiments of the present invention will be described below in more detail, with reference to the accompanying drawings, of which.

DETAILED DESCRIPTION OF EXEMPLARY EMBODIMENTS OF THE INVENTION

Exemplary embodiments of the invention will now be discussed in further detail. This invention may, however, be embodied in many different forms and should not be construed as limited to the embodiments set forth herein.

Figure 1:
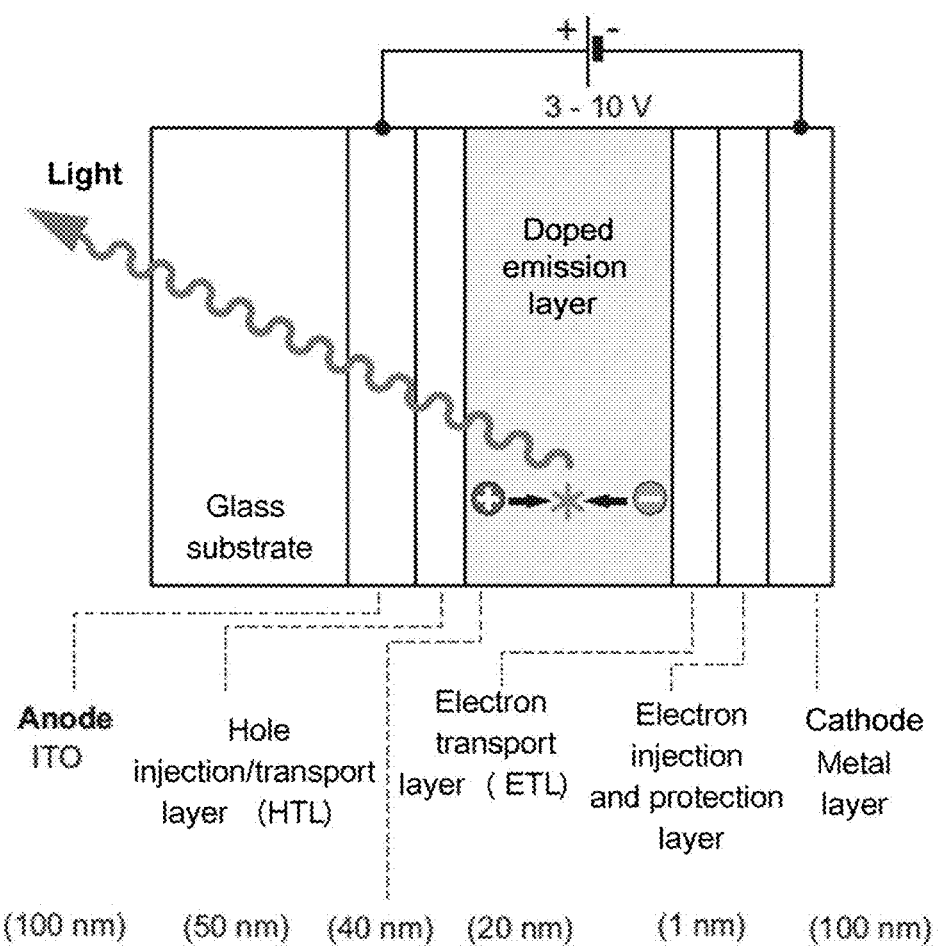
FIG. 1 shows the basic structure of an organic light emitting diode (OLED). The figure is not drawn to scale.
Figure 2:
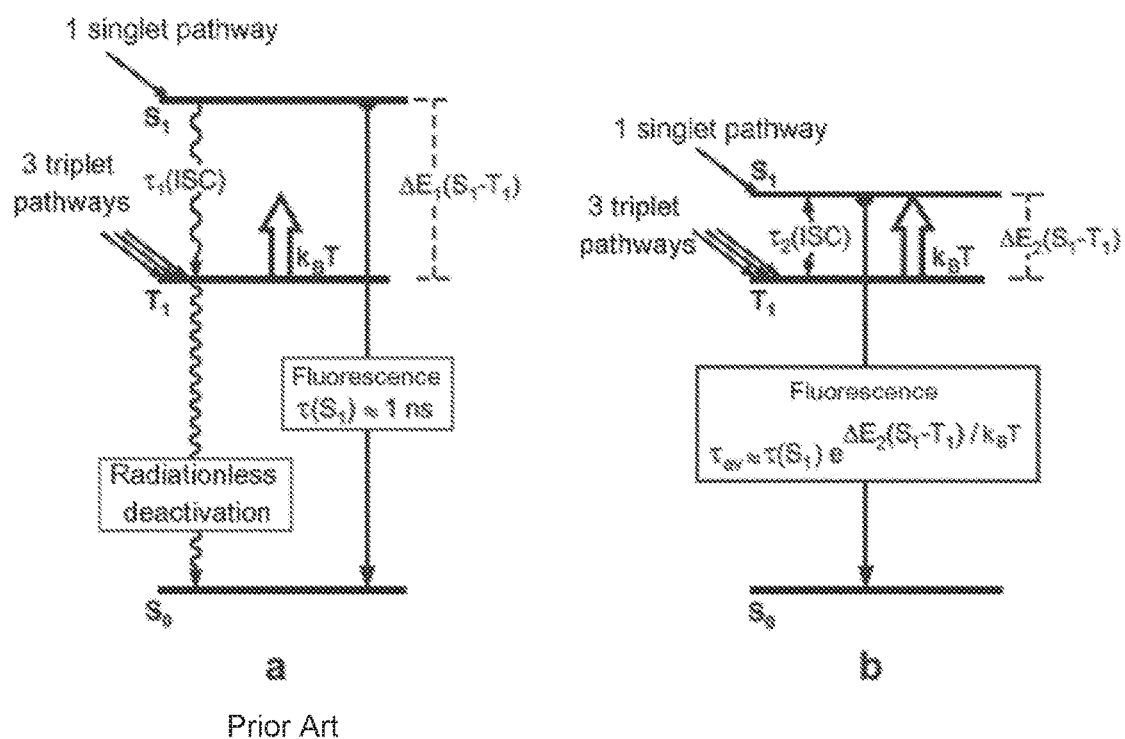
FIG. 2a shows an illustration of the electroluminescence characteristics for typical organic molecules according to the prior art.
FIG. 2b shows an illustration of the electroluminescence characteristics for molecules selected according to embodiments of the present invention.

The problems described above can be significantly improved or solved by the present invention, using organic molecules (dyes, emitter molecules) which have particular electronic structures or singlet-triplet energy separations and which are modified in accordance with the invention by changes in the immediate environment of the emitters. This process of "singlet harvesting for organic emitters" which is proposed here for the first time is to be described briefly below using FIG. 2:

FIG. 2a shows a (simplified) energy level scheme for a typical, purely organic molecule having a $\Delta E(S_1-T_1)$ value between the lowermost excited singlet state ($S_1$) and the triplet state ($T_1$) below it of clearly greater than 3000 cm$^{-1}$.

Using this scheme, the photophysical electroluminescence properties of these molecules can be illustrated. Hole-electron recombination, as occurs, for example, in an optoelectronic component, leads, on statistical average, to 25% occupation of the singlet state and to 75% occupation of the three sub-states of the triplet state. Since the emission transition from the triplet state $T_1$ to the singlet state $S_0$ is strongly spin-forbidden in organic molecules due to the low level of spin-orbit coupling, the excitation energy which arrives at the triplet state is generally converted radiationlessly to heat and is thus been lost for the light production by electroluminescence. The occupied singlet state can, however, exhibit effective emission (fluorescence) because this is a spin-allowed singlet-singlet transition. In this context, it is important to mention that the radiationless relaxation process from the $S_1$ state to the $T_1$ state, called the intersystem crossing (ISC) process, is likewise strongly forbidden due to the low level of spin-orbit coupling. Otherwise, no fluorescence would be observable. For the time constants, this means that $\tau_1(ISC)$ is several orders of magnitude longer than the fluorescence lifetime, which is in the region of one to a few nanoseconds for $\tau(S_1)$.

According to the invention, the above-described disadvantages of the prior art can be avoided. This is possible by a combination of two steps:

I. Organic molecules with high emission quantum yield (greater than 50%) are provided, for which the energy difference between the singlet $S_1$ and the triplet $T_1$ is sufficiently small than thermal repopulation from the triplet $T_1$ to the singlet $S_1$ is possible at room temperature, as a result of which the triplet excitation can be converted to light via the singlet $S_1$ state. This is achieved according to the invention using purely organic molecules, for instance using organic molecules of the formulae I, II, III, IV and/or V.

II. The extremely long intersystem crossing time constant ($\tau(ISC)$) of purely organic molecules is shortened by a few orders of magnitude in order to enable sufficiently rapid thermal repopulation, the so-called up-intersystem-crossing. This is possible by virtue of enhancement of spin-orbit coupling, in particular by additional introduction of atoms or molecules which have a high level of spin-orbit coupling. The increase of the spin-orbit coupling can also result from covalent bonding of an additive to the emitter molecule. These effects are known to the chemist as "external" or "internal heavy atom effect". This process is explained further below.

Using these two strategies, which are to be used together—as illustrated by FIG. 2b—the triplet and singlet excitations populated in the electroluminescent excitation can be collected and converted to light via the singlet state $S_1$. This process exploiting the singlet harvesting effect for organic molecules, which is described here for the first time, is explained in detail hereinafter.

Accordingly, the invention, in one aspect, provides a composition, especially for utilization in an optoelectronic device, which comprises an organic emitter molecule having a lowest excited singlet state ($S_1$) and a triplet state ($T_1$) below it, the $\Delta E(S_1-T_1)$ value of the organic molecule being less than 3000 cm$^{-1}$ (preferably smaller than 2500 cm$^{-1}$), in particular between 10 cm$^{-1}$ and smaller than 3000 cm$^{-1}$, and an optically inert atom or molecule which interacts with the organic molecule such that the intersystem crossing time constant of thermal repopulation, i.e. the up-intersystem crossing time constant, of the organic molecule is reduced to less than 300 ms, preferably to less than 1 ms, more preferably to less than 1 µs. In a preferred embodiment, this is accomplished by an optically inert atom or molecule, which has, or by molecular components which have a high level of spin-orbit coupling. This can be described by the spin-orbit coupling constant, which should be higher than about 200 cm$^{-1}$, preferably higher than 1000 cm$^{-1}$ and more preferably higher than 2000 cm$^{-1}$, most preferably greater than 4000 cm$^{-1}$.

The terms "spin-orbit coupling constant" and "intersystem crossing time constant" and "up-intersystem crossing time constant" are specialist terms which are commonly used in the photophysical literature and are therefore known to those skilled in the art.

Molecules with Small $\Delta E(S_1-T_1)$-Separations

FIG. 2b shows an energy level diagram for an organic molecule having a small energy difference $\Delta E(S_1-T_1)$<3000 cm$^{-1}$. This energy difference is small enough to enable thermal repopulation of the $S_1$ state from the $T_1$ state according to a Boltzmann distribution, or according to the thermal energy $k_BT$, and hence thermally activated light emission from the $S_1$ state. This process, which is referred to as thermally activated (delayed) fluorescence, is simplified controlled by equation (1)

$$\text{Int}(S_1 \rightarrow S_0)/\text{Int}(T_1 \rightarrow S_0) = k(S_1)/k(T_1)\exp(-\Delta E/k_BT) \quad (1)$$

In this equation, $\text{Int}(S_1 \rightarrow S_0)/\text{Int}(T_1 \rightarrow S_0)$ is the intensity ratio of the emissions from the $S_1$ state and the $T_1$ state. $k_B$ is the Boltzmann constant and T the absolute temperature. $k(S_1)/k(T_1)$ is the rate ratio of the conversion processes from the singlet $S_1$ and from the triplet $T_1$ to the electronic ground state $S_0$. For organic molecules, this ratio is generally between $10^6$ and $10^{10}$. Preference is given in accordance with the invention to molecules having a rate ratio of about $10^7$, better of about $10^9$, more preferably of about $10^{10}$. $\Delta E$ represents the energy difference $\Delta E_2(S_1-T_1)$ according to FIG. 2b.

Through the process of thermal repopulation described, an emission channel is opened up from the populated triplet via the singlet state $S_1$. Since the transition from the $S_1$ to the $S_0$ state is strongly allowed, the triplet excitation energy, which is otherwise lost, is obtained virtually completely as light emission via the singlet state. At a given temperature, for example at room temperature, the smaller the energy difference $\Delta E$, the more marked this effect is. Preference is therefore given to organic molecules having a $\Delta E = \Delta E(S_1-T_1)$ value between the lowermost excited singlet state and the triplet state below it of less than 3000 cm$^{-1}$, better less than 2500 cm$^{-1}$ or 1500 cm$^{-1}$, preferably of less than 1000 cm$^{-1}$.

This effect is to be illustrated by a numerical example. Given an energy difference of $\Delta E=1300$ cm$^{-1}$, for room temperature applications (T=300 K) with $k_BT=210$ cm$^{-1}$ and a rate ratio of $10^8$, an intensity ratio of the singlet to triplet emission according to equation (1) of approx. $2 \cdot 10^5$ is obtained. This means that the singlet emission process is dominant to an extreme degree for a molecule having these example values.

The applicability of equation (1) requires according to the invention the use of additives which increase spin-orbit coupling (for detailed arguments see, for example, below). These additives, i.e. optically inert atoms or molecules of the composition, interact with the organic emitter molecules such that the mean (thermalized) emission lifetime of the two states $S_1$ and $T_1$ of the organic molecule is strongly reduced. Preference is given to compositions of such a kind that the emission lifetime is reduced to less than 500 ms, preferably to less than 1 ms, particularly preferably to less than 20 μs, more preferably to less than 10 μs and most preferably to less than 1 μs. It is essential that the time of the thermally activated reoccupation from the $T_1$ state is shorter (e.g. by factor 5) than the phosphorescence decay time $\tau(T_1)$ without thermal reoccupation. This decay time $\tau(T_1)$ can be easily detected at low temperatures, e.g. at 77 K, with commercial measurement instruments.

In summary, using this "singlet harvesting process for organic molecules", it is thus possible in the ideal case to capture virtually all, i.e. a maximum of 100%, of the excitons and convert them to light via singlet emission. In addition, it is possible to shorten the emission decay time well below the value for purely organic triplet emitters, which is a few seconds. Therefore, the inventive composition is particularly suitable for optoelectronic components.

Organic molecules having the above-described properties, i.e. having a small singlet-triplet energy difference $\Delta E(S_1-T_1)$, are preferably organic molecules having the following general formulae I to III:

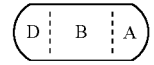

Formula I

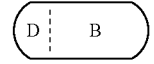

Formula II

Formula III

In these formulae, D is a chemical group or a substituent with an electron-donating effect (D, donor effect). Substituents of this kind may be present once, twice or several times. They may be the same or different.

A is a chemical group or a substituent with an electron-withdrawing property (A, acceptor effect). Substituents of this kind may be present once, twice or several times. They may be the same or different.

The base structure B is composed of conjugated organic groups which consist for example of aromatic, heteroaromatic and/or conjugated double bonds. In one embodiment, the base structure can also represent a non-conjugated group. It is essential that the molecule orbitals of A and B or of D and B cover the same area. The base structure B itself can also have an electron withdrawing effect, then (e.g. in formula I) the substitution can have D character on both sides. Alternatively, the base structure B itself can have an electron donating effect, then (e.g. in formula I) the substitution can have A character on both sides.

The formulas I to III represent also that the electronic wave functions of the molecules overlap in the areas D/B or B/A. This characteristic can be determined by calculations as described further below. The term electronic wave function is known to the person skilled in the art.

Examples of Donors D:
—O(—), —NH-alkyl group, —N-(alkyl group)$_2$-NH$_2$, —OH, —O-alkyl group, —NH(CO)alkyl group, —O(CO)-alkyl group, -aryl group, -heterocyclic groups —(CH)=C-(alkyl group)$_2$, -phenoxazinyl, -phenothiazinyl, -carbazolyl, -dihydrophenazinyl, —N(R')(R") with (R', R"=H, alkyl, aryl, halogenated alkyl, halogenated aryl), all aryl and heterocyclic groups can be substituted with alkyl and/or aryl groups, all alkyl groups can also be substituted with F, Cl, Br and/or I.

Examples of Acceptors A:
-halogen, —(CO)H, —(CO)-alkyl group, —(CO)O-alkyl group, —(CO)OH, —(CO)Cl, —CF$_3$, —BF$_2$, —CN, —S(O)$_2$OH, —S(O)$_2$O-alkyl, —NH$_3^+$, —N(alkyl group)$_3^+$, —NO$_2$, halogenated alkyl, —B(R')(R") with (R', R"=H, alkyl, aryl, halogenated alkyl, halogenated aryl).

Composition of the Base Structure B:
B is composed of conjugated organic groups which consist of aromatic, heteroaromatic and/or conjugated double bonds. In certain embodiments, molecular base structures B have aromatic or heteroaromatic rings smaller than 15, more preferably smaller than 10, most preferably smaller than seven. The aromatic or heteroaromatic rings are chemically joined directly or chemically bound via alkenyl groups having conjugated double bonds smaller than 10, more preferably smaller than six and most preferably smaller than 3. In one embodiment, the base structure can also represent a non-conjugated group. It is essential that the molecule orbitals of A and B or of D and B cover the same area.

The organic molecules described by formulas I to III have $\Delta E(S_1-T_1)$ values between the lowermost excited singlet state and the triplet state below it of less than 3000 $cm^{-1}$, preferably less than 2500 $cm^{-1}$ or 1500 $cm^{-1}$ and more preferably less than 1000 $cm^{-1}$. Processes for measurement or calculation of the $\Delta E(S_1-T_1)$ values are discussed below.

Preference is given to organic molecules which, without use of additives, have a high fluorescence quantum yield from the $S_1$ state of greater than 30%, preferably greater than 50%, more preferably greater than 80% (determination with commercial measuring instruments for emission quantum yield) and for which the absorption intensities, i.e. the molar decadic extinction coefficients, of the transitions between the ground state $S_0$ and the excited state $S_1$ are greater than $10^3$ l/mol cm, preferably greater than $10^4$ l/mol cm, more preferably greater than $5 \times 10^4$ l/mol cm (determination with commercial absorption spectrometers).

The invention relates, in a further aspect, to a process for selecting organic molecules for which the $\Delta E(S_1-T_1)$ value between the lowermost excited singlet state ($S_1$) and the triplet state ($T_1$) below it is less than 3000 $cm^{-1}$, preferably less than 2500 $cm^{-1}$ or 1500 $cm^{-1}$, particularly preferably less than 1000 $cm^{-1}$.

The determination of the $\Delta E(S_1-T_1)$ value can either be performed by quantum-mechanical calculations using known computer programs (for example executing TDDFT calculations, for example using commercially available Gaussian 09 or ADF-Amsterdam Density Functional Software programs) or determined experimentally, as explained below. Information for a first orientation can already be gained from comparatively easily to conduct DFT calculations (e.g. with commercially available Gaussian 09 or ADF-Amsterdam Density Functional Software Program). Here, for example, the frontier orbitals HOMO−2, HOMO−1, HOMO, LUMO, LUMO+1 and LUMO+2 show tendencies of the charge transfer properties to expect with regard to the lowest excited energy states of the molecules. In the following paragraph these properties are described.

The energy difference $\Delta E(S_1-T_1)$, more particularly of the organic molecules described by formulas I to III, can be described as an approximation by quantum-mechanical means via the exchange integral multiplied by the factor 2. The value of the latter depends directly on the overlap of the molecular orbitals in the area on the D side of B with the molecular orbitals in the area on the A side of B (formula I). Accordingly, the value of the exchange integral is determined by the overlap of the wave functions in the D-B area (formula II) or the A-D area (formula III) with those in the B area. Due to the properties of D and A described above, these molecular orbitals are distributed over different spatial areas (partly delocalized over π or π* molecular orbitals). This means that an electronic transition between the different molecular orbitals represents a charge transfer (CT) process or a process with CT involvement within the molecule. The target small exchange integral and thus a small energy difference $\Delta E(S_1-T_1)$ can be achieved with an organic molecule which has the corresponding CT character with regard to the lowest excited molecule orbitals, wherein the molar decadic extinction coefficients for the electronic transition from $S_0$ to $S_1$ also lie in the preferred range defined above. In other words, $\Delta E(S_1-T_1)$ can be varied via the strengths of the electron-donating and -withdrawing substituents/groups of the organic molecule. Due to these photophysical (quantum-mechanical) properties, it is possible to achieve the inventive energy differences with $\Delta E(S_1-T_1)$ of less than 3000 $cm^{-1}$ or less than 2500 $cm^{-1}$ or less than 1500 $cm^{-1}$ or less than 1000 $cm^{-1}$.

The $\Delta E(S_1-T_1)$ value can be determined experimentally as follows:

For a given organic molecule, the energy separation $\Delta E(S_1-T_1)=\Delta E$ can be determined in a simple manner using the above-specified equation (1). A rearrangement yields:

$$\ln\{\text{Int}(S_1 \to S_0)/\text{Int}(T_1 \to S_0)\} = \ln\{k(S_1)/k(T_1)\} - (\Delta E/k_B)(1/T) \quad (2)$$

For the measurement of the intensities $\text{Int}(S_1 \to S_0)$ and $\text{Int}(T_1 \to S_0)$, it is possible to use any commercial spectrophotometer. A graphic plot of the (logarithmic) intensity ratios $\ln\{\text{Int}(S_1 \to S_0)/\text{Int}(T_1 \to S_0)\}$ measured at different temperatures against the reciprocal of the absolute temperature T generally yields a straight line. The measurement is conducted within a temperature range from room temperature (300 K) to 77 K or to 4.2 K, the temperature being established by means of a cryostat. The intensities are determined from the (corrected) spectra, $\text{Int}(S_1 \to S_0)$ and $\text{Int}(T_1 \to S_0)$ representing, respectively, the integrated fluorescence and phosphorescence band intensities, which can be determined by means of the programs provided with the spectrophotometer. The respective transitions (band intensities) can be identified easily since the triplet band is at lower energy than the singlet band and gains intensity with falling temperature. The measurements are conducted in oxygen-free dilute solutions (approx. $10^{-2}$ mol $L^{-1}$) or on thin films of the corresponding molecule or on films doped with the corresponding molecules. If the sample used is a solution, it is advisable to use a solvent or solvent mixture which forms glasses at low temperatures, such as 2-methyl-THF, THF (tetrahydrofuran) or aliphatic hydrocarbons. If the sample used is a film, the use of a matrix having a much greater singlet and triplet energy than that of the organic emitter molecules, for example PMMA (polymethyl methacrylate), is suitable. This film can be applied from solution. It is particularly important that, as described below, the molecules to be analyzed are used with the respective additives.

The slope of the straight line is $-\Delta E/k_B$. With $k_B = 1.380 \cdot 10^{-23}$ $JK^{-1} = 0.695$ $cm^{-1}$ $K^{-1}$, it is possible to determine the energy separation directly.

An equivalent approach shows that it is also possible to determine the $\Delta E(S_1-T_1)$ value by means of the temperature dependence of the emission decay time.

A simple, approximate estimation of the $\Delta E(S_1-T_1)$ value can also be made by recording the fluorescence and phosphorescence spectra at low temperature (e.g. 77 K or 4.2 K using a cryostat). The $\Delta E(S_1-T_1)$ value then corresponds approximately to the energy difference between the high-energy slope flanks of the fluorescence band and the phosphorescence band, respectively.

The more marked the CT character of an organic molecule, the greater the variation in the electronic transition energies as a function of solvent polarity (cf. e.g. J. B. Birks, Photophysics of Aromatic Molecules, Wiley-Interscience, London 1970; E. Lippert, Z Naturforsch. 10a (1955) 541). For instance, the evidence of a marked polarity dependence of the emission energies provided by a simple measurement already indicates the presence of a CT-transition and thus indicates small $\Delta E(S_1-T_1)$ values.

Moreover, it is important to reduce the radiationless processes (rates), because it leads to an increase of the emission quantum yields of the emitter molecules.

For instance, in one embodiment of the invention, the protons of the emitter molecules are partly or completely replaced by deuterium.

In an optional embodiment, deuterizing or partly deuterizing the matrix of the optoelectronic device can in particular cases also lead to a distinct increase of the emission quantum yield.

Another method for the reduction of the radiationless processes, i.e. for increasing the emission quantum yield of the emitter molecules, consists in shaping the direct environment as rigid as possible by selecting e.g. a polymer matrix or a polymer cross-linked matrix or a semi-crystalline matrix. Strategies of polymer cross-linking are known to a person of skill in the art (see e.g. C. A. Zuniga, S. Barlow, S. R. Marder; Chem. Materials 2011, 23, 658-681). The matrix used in the examples, glucose-trehalose, meets this demand of rigidity.

Additives/Reduction of the Intersystem Crossing Time Constant

Preferred organic molecules consist exclusively of light atoms such as C, H, N, O, F, S, K, Na. For such organic molecules, the electronic singlet and triplet states of which result essentially from transitions between $\pi$ and $\pi^*$ molecular orbitals, the effective spin-orbit coupling (SOC), as already mentioned, is so small that the relaxation transitions from the $S_1$ to the energetically lower $T_1$ state (down-intersystem crossing) and in the reverse direction from the $T_1$ state to the $S_1$ state (up-intersystem crossing) are strongly forbidden or barely occur.

According to the invention, this is no longer forbidden: the organic molecules (emitter molecules), especially those of formulas I, II and III, as well as according to formulas IV and V, may be doped, for example, into optoelectronic devices, or into matrix materials, for example in an OLED emission layer. According to the invention, optically inert atoms or molecules (so-called "additives") are mixed into this matrix to reduce the intersystem crossing time constant of the organic molecule. These optically inert atoms or molecules are notable for high spin-orbit coupling (SOC) (SOC constant of the atoms or molecular units greater than 1000 cm$^{-1}$; see the explanations given further below). These additives are introduced, for example, in a concentration corresponding approximately to or higher than that of the emitter molecules. These additives can, for example, also be used in a concentration twice to ten times as high as that of the organic emitter molecules. In general, the numeric ratio between organic emitter molecules and optically inert atoms or molecules is 1:0.1 to 1:5 or 1:10, preferably 1:0.2 to 1:5, more preferably 1:1. This gives rise to such a distribution probability that at least one additive particle/additive molecule having high SOC is present in the immediate environment of an emitter molecule. This induces external SOC, which strongly accelerates the process of intersystem crossing, i.e. the time constant of the intersystem crossing is shortened accordingly. This brings about very rapid relaxation from the $S_1$ to the $T_1$ state and likewise a very rapid thermal repopulation according to equation (1). This enables the singlet harvesting effect for organic molecules.

According to the invention, it is also possible to change the matrix with suitable SOC increasing substituents; e.g. the matrix polymers can comprise chemically bound Br or I atoms, and thus, the matrix adopts the function of the additive. Likewise, the emitter molecules can comprise e.g. chemically bound Br or I atoms or other substituents increasing the SOC. In these particular cases, the amount of the additive can be highly reduced or the addition of an additive can be completely dispensed with under favorable conditions.

Accordingly, the present invention relates in one embodiment to a composition comprising an organic molecule for the emission of light, which has a $\Delta E(S_1-T_1)$ value between the lowest excited singlet ($S_1$) and the triplet state ($T_1$) below it of smaller than 3000 cm$^{-1}$ (preferably smaller than 2500 cm$^{-1}$), and an optical inert atom or an optical inert molecule for reducing the up-intersystem crossing time constant of the organic molecule to less than 300 ms, wherein the optical inert atom or an optical inert molecule is chemically bound to a matrix, in particular to a polymeric matrix.

Examples of the additives are:

Noble gases (especially preferred):
  Krypton (Kr), but more preferably xenon (Xe). These gases are introduced during the process for producing an optoelectronic component into the matrix, which has been doped with the emitter molecules and is used to form the emission layer. It is necessary in this context to ensure gas saturation at a gas pressure of 1 atmosphere (1013.25 hPa), optionally under elevated gas pressure of up to about 3 atm (approx. 300 kPa), for example of about 2 atm (approx. 200 kPa). The emission layer is applied under this gas atmosphere, for example, by means of spin-coating or other wet-chemical processes.

Bromine- and iodine-containing substances, particular preference being given to iodine-containing substances. Br— or particularly preferably I-containing substances are added to the solution used to produce the emission layer of an optoelectronic component, for example, alkyl bromides, alkyl iodides (e.g. ethyl iodide, propyl iodide), aryl bromide, aryl iodide (e.g. naphthyl iodide). Optoelectronic devices using these additives are produced by wet-chemical means.

The matrix material of the emission layer of an optoelectronic component may consist of bromine-containing substances, but particularly preferably of iodine-containing substances or polymer-bound Br or I, or comprise these substances (e.g. poly(4-iodostyrene). The halogens may also be present in chemically bound form in the polymer side groups. Optoelectronic devices using these additives are produced by wet-chemical means.

Suitable additives are also nanoparticles of metal atoms of the second or preferably third period of the transition metals, or gadolinium. Optoelectronic devices using these additives are produced by wet-chemical means or by means of vacuum or vapor phase deposition processes.

Preferred additives are Gd complexes. These can be added to the solutions of the emission layers used in the production for wet-chemical processing operations, or co-vaporized in the case of production of the optoelectronic devices by means of vacuum sublimation or vapor phase deposition. Particular preference is given to chemically stable Gd complexes which are optically inert within the spectral range required for the application. Examples are: Gd(cyclopentadiene)$_3$, Gd(tetramethylheptadiene)$_3$, Gd acetate, Gd(acac)$_3$, Gd(TMHD)$_3$, Gd 2-ethylhexanoate, etc. Gd ions are considered to be optically inert and can be used in a further aspect of the invention. For example, these Gd ions can also enter into chemical bonds with the organic emitter molecules. Gd complexes can be formed, for example. Lead compounds are referred to as further additives, e.g. $Pb(CH_3COO)_2$.

Suitable additives are generally atoms or molecules or nanoparticles which do not have any absorptions or emissions in the emission region or relevant HOMO/LUMO region of the emitter, and hence are considered to be optically inert within these regions. The additives, or the atomic constituents thereof, should also have a high SOC constant which is preferably greater than 1000 $cm^{-1}$, more preferably greater than 3000 $cm^{-1}$, most preferably greater than 4000 $cm^{-1}$.

OLED Devices as Optoelectronic Devices

In a further aspect of the invention, the composition described here is used in an emitter layer in an optoelectronic (organic electronic) device, especially an OLED.

The OLED devices can be produced by processes known in the art (cf. H. Yersin, "Highly Efficient OLEDs with Phosphorescent Materials", Wiley-VCH, Weinheim, Germany 2008).

In a preferred embodiment of an organic light-emitting diode (OLED), the proportion of the composition (organic emitter and additive) in the emitter layer is between 2% by weight and 100% by weight, preferably between 6% by weight and 30% by weight.

Further Optoelectronic Devices

Another aspect of the invention refers to the use of the inventive composition composed of an organic molecule and an optically inert atom or optically inert molecule in light-emitting electrochemical cells (LEECs), OLED sensors (e.g. OLED oxygen sensors), especially in a gas and vapor sensor not hermetically sealed from the outside, optical temperature sensors, organic solar cells (OSCs; organic photovoltaics, OPVs), organic field-effect transistors, organic diodes, organic photodiodes and "down conversion" systems.

Generally, the proportion of the composition in an emitter layer of an optoelectronic device may be 2 to 100% by weight, preferably 6 to 30% by weight, based on the total weight of the emitter layer.

In a further aspect, the invention relates to a process for reducing the (radiative) emission lifetime and to a process for increasing the electroluminescence quantum yield of an organic molecule as an emitter in an optoelectronic device. In this case, an organic molecule which has a $\Delta E(S_1-T_1)$ value between the lowermost excited singlet state ($S_1$) and the triplet state ($T_1$) below it of less than 3000 $cm^{-1}$ (preferably less than 2500 $cm^{-1}$) is introduced into the vicinity of an optically inert atom or molecule (optionally via a chemical bond), such that the organic molecule can interact with the optically inert atom or molecule. Due to a spin-orbit coupling constant of greater than 1000 $cm^{-1}$ of the optically inert atom or molecule or of parts of the optically inert molecule, a short mean emission lifetime (from the singlet $S_1$ and the triplet $T_1$ states) of the organic molecule as well as an increase in the emission quantum yield are achieved.

The invention further relates to a process for converting the triplet excitation energy of an organic molecule generated in the course of electroluminescence to fluorescence energy. This aspect involves the interaction of an organic molecule having a $\Delta E(S_1-T_1)$ value between the lowermost excited singlet state ($S_1$) and the triplet state ($T_1$) below it of less than 3000 $cm^{-1}$ (preferably less than 2500 $cm^{-1}$) with an optically inert atom or molecule such that triplet excitation energy of the organic molecule is converted via a singlet state of the organic molecule to fluorescence energy by thermal activation at a temperature higher than a temperature at which for example OLEDs are used, i.e. for example above −30° C.

The invention also relates to a process for selecting organic molecules for which the $\Delta E(S_1-T_1)$ value between the lowermost excited singlet state ($S_1$) and the triplet state ($T_1$) below it is less than 3000 $cm^{-1}$, preferably less than 2500 $cm^{-1}$ or 1500 $cm^{-1}$, particularly preferably less than 1000 $cm^{-1}$. The process comprises at least two steps, namely: firstly the determination of the $\Delta E(S_1-T_1)$ value of organic molecules by means of a) a quantum-mechanical molecular calculation, b) measurement of the temperature dependence of the fluorescence and phosphorescence intensities, or c) measurement of the temperature dependence of the emission decay time, and secondly the finding of organic molecules for which the $\Delta E(S1-T1)$ value less than 3000 $cm^{-1}$, preferably less than 2500 $cm^{-1}$ or 1500 $cm^{-1}$, particularly preferably less than 1000 $cm^{-1}$. The organic molecules thus found have a $\Delta E(S_1-T_1)$ value between the lowermost excited singlet state ($S_1$) and the triplet state ($T_1$) below it of less than 3000 $cm^{-1}$, preferably less than 2500 $cm^{-1}$ or 1500 $cm^{-1}$, particularly preferably less than 1000 $cm^{-1}$.

EXAMPLES

From the multitude of realizable organic molecules having a small singlet $S_1$-triplet $T_1$ energy difference, using the example of the emitters of formulas I to III, some examples are given, these having the following properties:

The materials are very good emitters.

The absorption and fluorescence transitions between the $S_0$ and $S_1$ states are allowed. Thus, the emission decay times $\tau(S_1)$ are short.

The examples include molecules having emissions from a broad spectral range.

An example of an organic molecule is defined by formula IV.

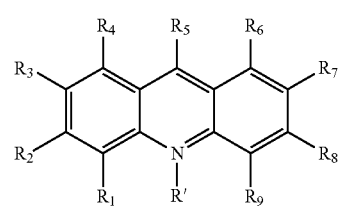

Formula IV

Herein, $R_1$ to $R_9$ are =H, Br, I and/or groups, which are summarized in the examples for the donators D and/or acceptors A mentioned above. Adjacent $R_i$, $R_j$ and $R_k$ from $R_1$ to $R_9$ can be conjugated aromatic or heteroaromatic rings. Preferably Br and/or I also cause an increase of the spin orbit coupling.

R' is either not present or H, Alkyl, O, S.

A further example for an organic molecule according to the invention is defined by formula V.

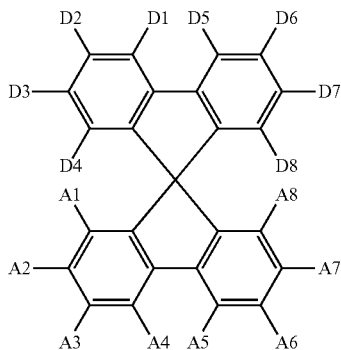

Formula V

Herein, D1 to D8 are independently from each other H, Br, I and/or donator groups such as defined above by D. The donator groups can be same or different. Thereby at least one donator group must be present. A1 to A8 are independently from each other H, Br, I and/or acceptor groups such as defined above by A. Thereby at least one acceptor group must be present. The acceptor groups can be same or different.

For the molecules according to formulas IV and V, it is particularly important that a selection is made in a way that a charge transfer transition component occurs within the resulting molecule. This can be determined according to the state of art by DFT or TDDFT calculations. Br or I can also be bound to the aromatic base structure via a short alkyl group (with C=1 or 2). The intramolecular spin orbit coupling can also be increased as desired by chemically bound Br or I. In this case, the amount of an inert additive for increasing the spin orbit coupling could be highly reduced or completely dispensed with.

In case the additive is covalently bound to the organic molecule, the composition according to the invention thus relates to only one molecule. The additive covalently bound to the organic molecule in this case is then responsible for the increase of the spin-orbit coupling. Preferably, such additives are iodine and/or bromine.

In a further aspect, the invention relates to the use of a mixture (composition) comprising or consisting of glucose and/or trehalose as matrix with a composition according to the type described herein in an optoelectronic device. The ratio of glucose to trehalose can be from 5:1 to 1:5. Preferred is a ratio of 1:1.

In FIGS. 3 to 13, concrete execution examples as well as time-integrated and time-resolved spectra and decay curves are shown as well as the calculated HOMO and LUMO contour curves for one example.

In FIG. 2b, the molecules have been modified in their immediate environment by additives in order to enable the "singlet harvesting process for organic molecules".

Figure 3:
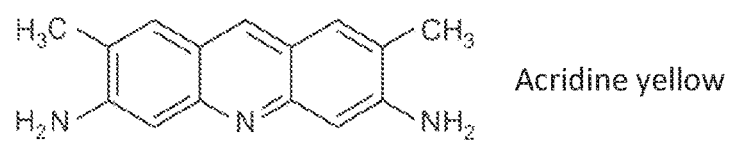
FIG. 3 shows a chemical structure of acridine yellow as an example of a purely organic emitter molecule according to an embodiment of the present invention.

In FIG. 3, the acridine yellow, which, using the combination of emitter molecule and additive, is suitable for the utilization of the singlet harvesting process.

Figure 4:
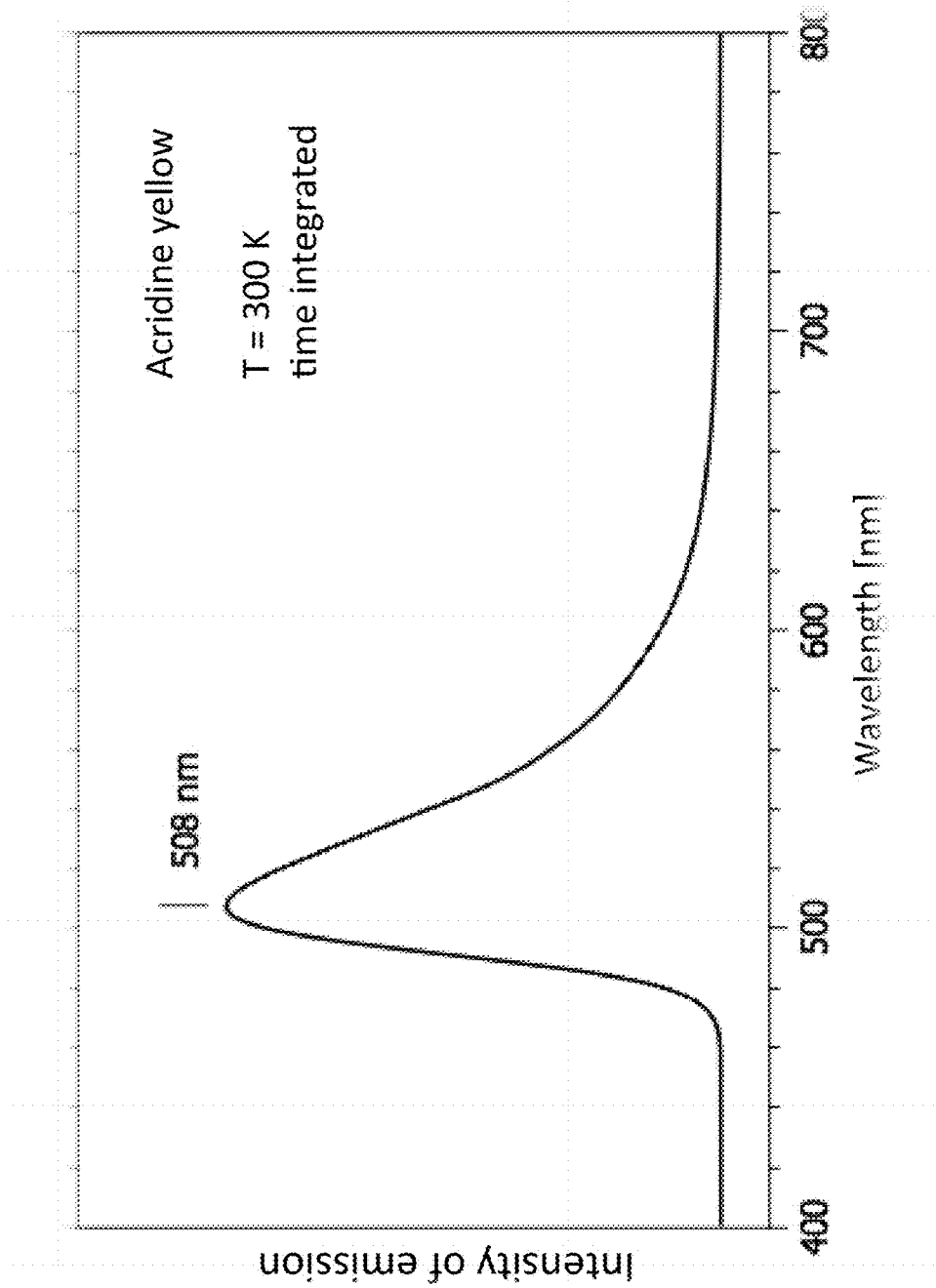
FIG. 4 shows a time integrated emission spectrum of acridine yellow (without additive) dissolved in a glucose-trehalose matrix measured at 300 K and excited at 378 nm according to an embodiment of the present invention.

In FIG. 4, the acridine yellow is dissolved in a glucose-trehalose matrix in a concentration of 1.67 μmol per 1 g of the mixture of glucose-trehalose. The emission with the maximum at 508 nm represents to a large extent an overlap of the spontaneous and the delayed fluorescence from the S1 state. A 1:1 glucose/trehalose mixture was used. Trehalose is a disaccharide with the elemental formula C12H22O11. The emis-sion quantum yield of the overall emission consisting of the spontaneous and the de-layed fluorescence as well as the phosphorescence is (95±5) %. The emission quantum yield was determined with a commercial measurement instrument.

Figure 5:
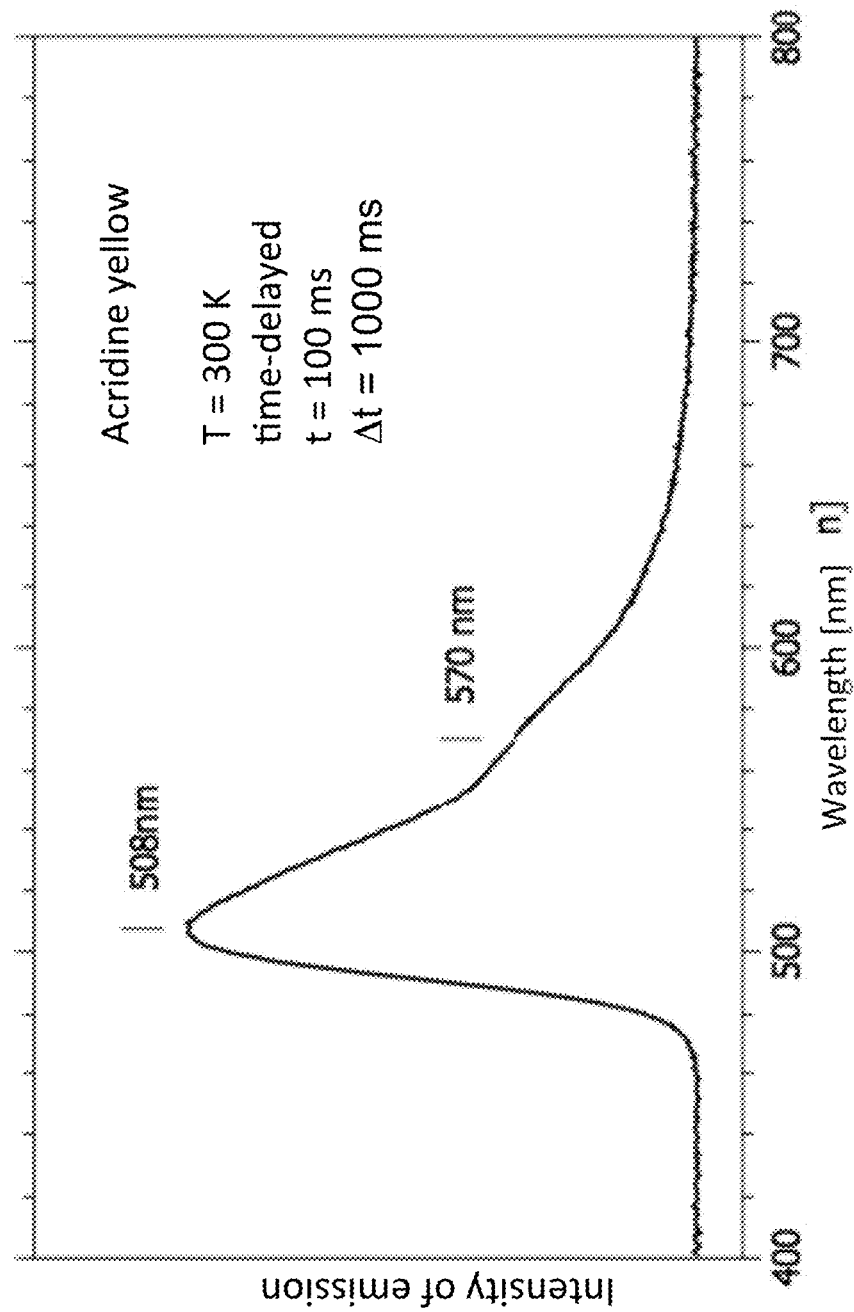
FIG. 5 shows a time-delayed emission spectrum of acridine yellow (without additive) dissolved in a glucose-trehalose matrix measured at 300 K and excited at 378 nm according to an embodiment of the present invention.

In FIG. 5, the acridine yellow is dissolved in a glucose-trehalose matrix in a concentration of 1.67 μmol per 1 g of the mixture of glucose-trehalose. The spectrum was registered after a time delay of t=100 ms with a time frame of Δt=1000 ms. Hereby, the long-lived phosphorescence band, which results from the T1 state and lies at 570 nm, is clearly em-phasized. The (time-delayed) main emission band at 508 nm represents the delayed fluorescence from the S1 state.

Figure 6:
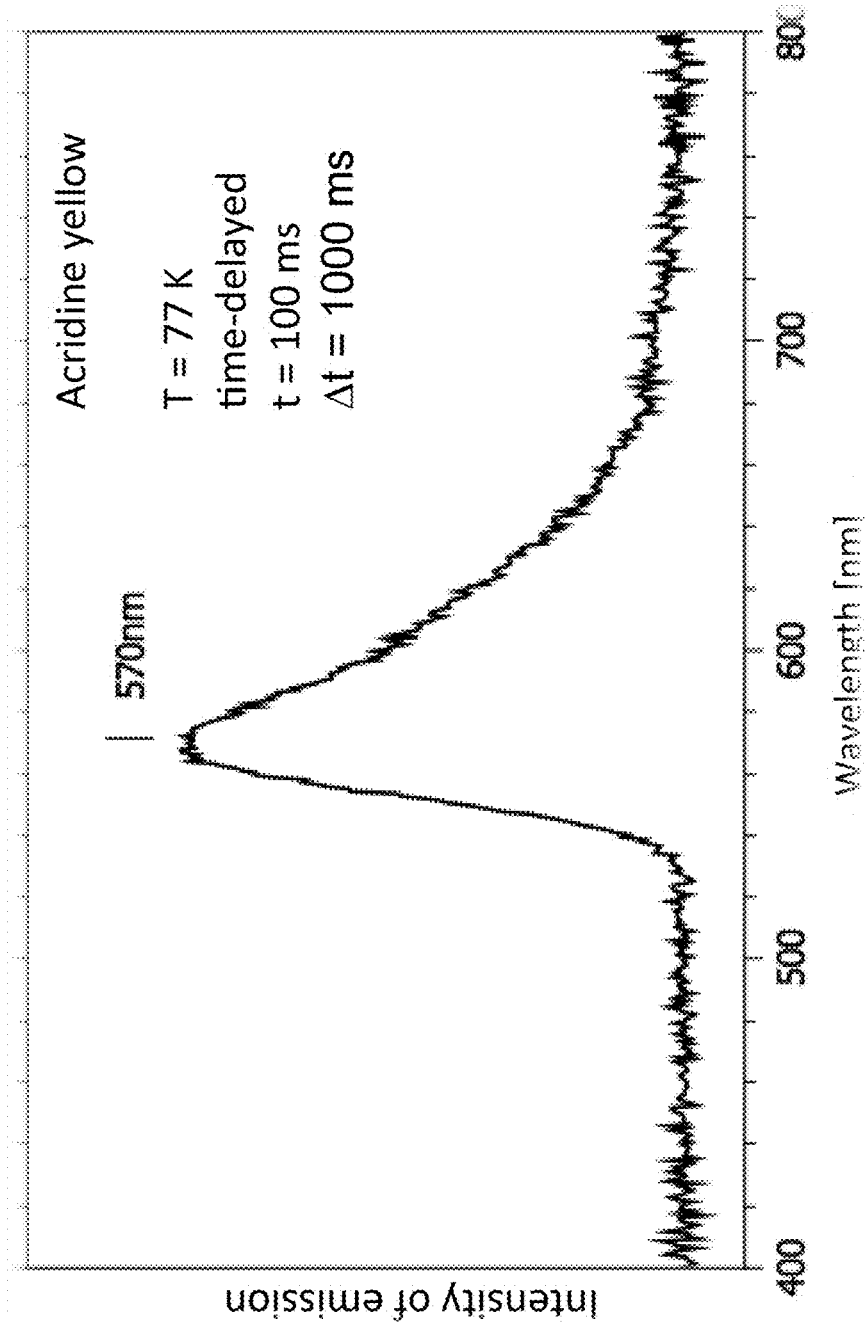
FIG. 6 shows a time-delayed emission spectrum of acridine yellow (without additive) dissolved in a glucose-trehalose matrix measured at 77 K and excited at 378 nm according to an embodiment of the present invention.

In FIG. 6, the acridine yellow is dissolved in a glucose-trehalose matrix in a concentration of 1.67 μmol per 1 g of the mixture of glucose-trehalose. The spectrum was registered after a time delay or t=100 ms with a time frame of Δt=1000 ms. At this low temperature, the thermal reoccupation of the singlet state S1 is not existing. Moreover, the registration of the short-lived (a few ns) spontaneous fluorescence is prevented by the selected time delay. Thus, this is a matter of a phosphorescence with the maximum at 570 nm, which results from the T1 state. Consequently the observed shoulder at the wavelength 570 nm in the spectrum shown in FIG. 5 also represents phosphorescence.

The recording of time-delayed emission spectra of acridine yellow with additive Pb(CH$_3$COO)$_2$ shows at 300 K no detectable phosphorescence band form the T$_1$ state, but only a delayed fluorescence band from the S$_1$ state. The substance was excited at 378 nm and the spectrum was recorded after a time delay of t=100 ms with a time frame of Δt=1000 ms. A glucose-trehalose mixture was used as matrix. This matrix contained 2.50 μmol (acridine yellow) and as additive 25.3 μmol (Pb(CH$_3$COO)$_2$) per 1 g of the mixture glucose-trehalose. This corresponds to an (acridine yellow)/(Pb (CH$_3$COO)$_2$) molar ratio of about 1:10. This result clearly shows that the up-intersystem crossing effect is effective and thus prevents the appearance of phosphorescence form T$_1$ state. Therefore, it is shown that the excitation energy, which arrives at the T$_1$ state, is emitted at T=300 K by thermal activation via the S$_1$ state, i.e. as fluorescence. Thus, the suitability of this combination (emitter molecule (organic molecule) and additive), for the utilization of the singlet harvesting process is given.

Figure 7:
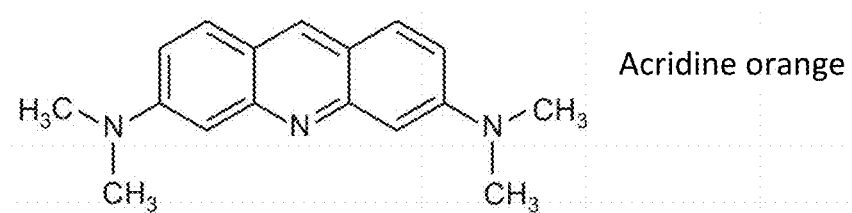
FIG. 7 shows a chemical structure of acridine orange as an example of a purely organic emitter molecule according to an embodiment of the present invention.

In FIG. 7, the acridine orange, which, using the combination of emitter molecule and additive, is suitable for the utilization of the singlet harvesting process.

Figure 8:
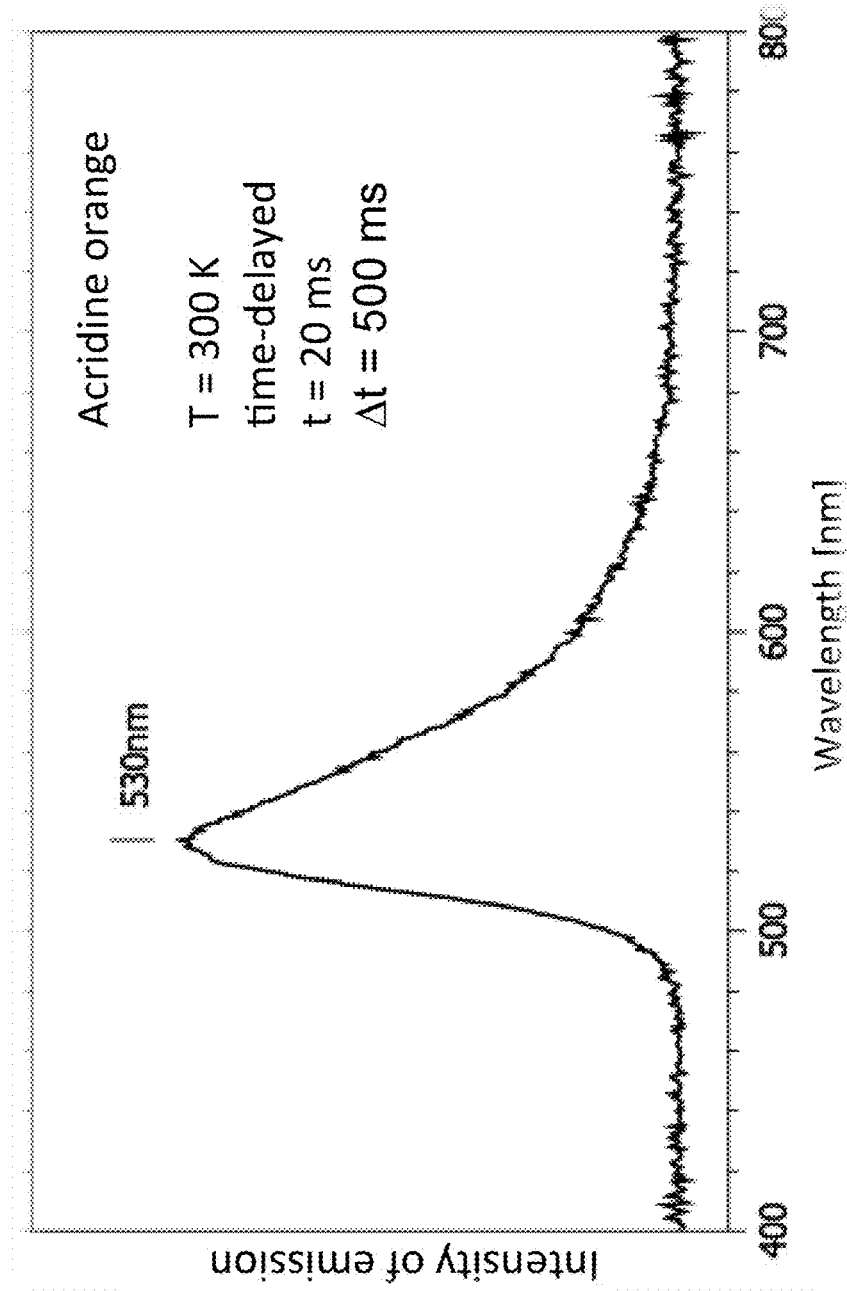
FIG. 8 shows a time-delayed emission spectrum of acridine orange (without additive) dissolved in a glucose-trehalose matrix measured at 300 K and excited at 378 nm according to an embodiment of the present invention.

In FIG. 8, the acridine orange is dissolved in a glucose-trehalose matrix in a concentration of 1.86 μmol per 1 g of the mixture of glu-cose-trehalose. The spectrum was registered after a time delay or t=20 ms with a time frame of Δt=500 ms. The emission with the maximum at 530 nm represents solely a delayed fluorescence from the S1 state since the short-lived (a few ns) spontaneous fluorescence has already decayed after the time de-lay. A 1:1 glucose-trehalose mixture was used.

Figure 9:
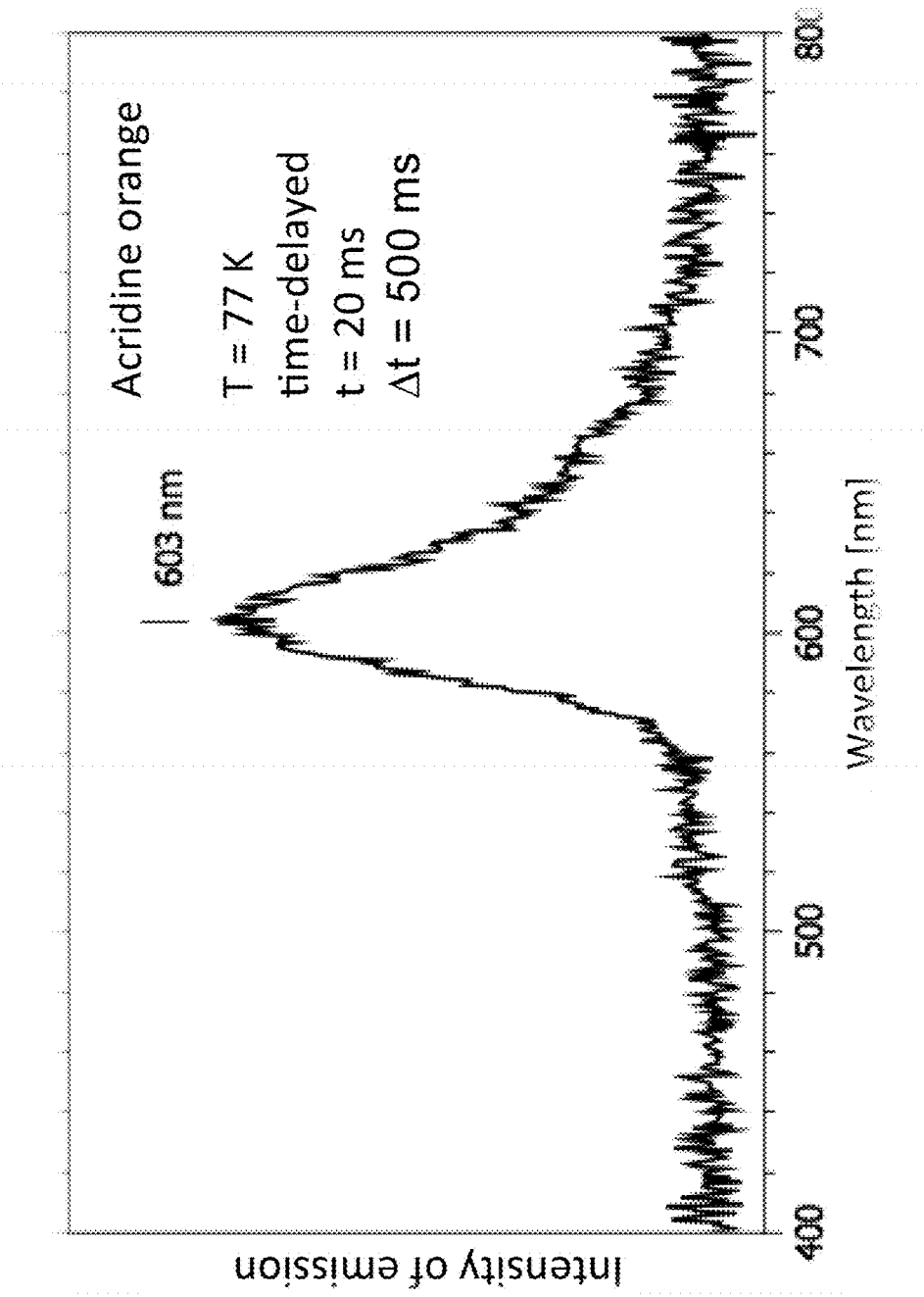
FIG. 9 shows a time-delayed emission spectrum of acridine orange (without additive) dissolved in a glucose-trehalose matrix measured at 77 K and excited at 378 nm according to an embodiment of the present invention.

In FIG. 9, the acridine orange is dissolved in a glucose-trehalose matrix in a concentration of 1.86 μmol per 1 g of the mixture of glu-cose-trehalose measured at 77 K and excited at 378 nm. The spectrum was registered after a time delay or t=20 ms with a time frame of Δt=1000 ms. At this low temperature, the thermal reoccupation of the singlet state S1 is not existing, i.e. the observed emission with the maximum at 603 nm does not represent a delayed fluorescence. Moreover, the registration of the short-lived (a few ns) spontaneous fluorescence is prevented by the selected time delay. As a result the observed spectrum represents a phosphorescence T1 state.

The studies with acridine orange clearly show that a delayed fluorescence occurs. It is shown that at T=300 K the excitation energy, which arrives at the $T_1$ state, is emitted by thermal activation via the $S_1$ state, i.e. as fluorescence. Thus, the suitability of this combination of such emitter molecules and additives for the utilization of the singlet harvesting process is given.

Figure 10:
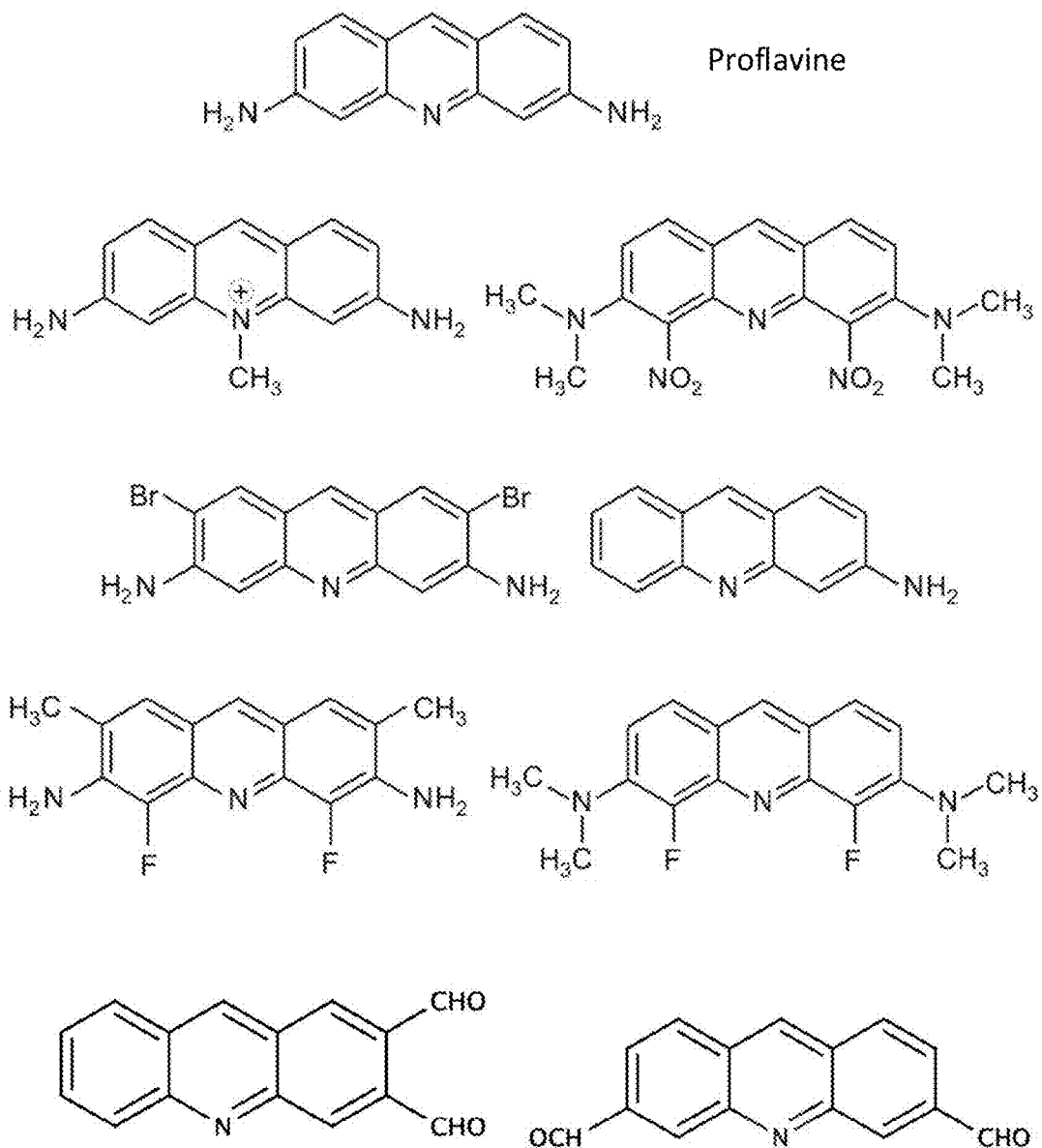
FIG. 10 shows chemical structures of further acridine derivatives as examples of purely organic emitter molecules according to an embodiment of the present invention.

In FIG. 10, the acridine derivatives, which, using the combinations of emitter molecules and additives, are suitable for the utilization of the singlet harvesting process.

In one possible embodiment of the composition according to the invention, the organic molecule is covalently bound to the atom increasing the spin-orbit coupling or to the molecule increasing the spin-orbit coupling, as exemplified by the first compound in the third row. In analogy to the example molecules shown in the last row, further organic molecules are preferably suitable, namely organic emitter molecules, which comprise aldehyde groups in the position $R_2$, $R_3$, $R_7$ and/or $R_8$ according to formula IV.

Organic emitter molecules can also be charged organic molecules and counter ions can be present. These emitter molecules can then be preferably applied in light-emitting electrochemical cells (LEECs or LECs), whose principle structure is known to the person skilled in the art. When using these charged organic molecules in OLEDs, it is, where applicable, advisable to replace the small counter ions by greater, comparably charged counter ions such as $(PF_6)^-$, $(BF_4)^-$, $[CF_3SO_2]^-$, singly negatively charged hexaphenyl-phosphate, singly negatively charged tetraphenyborate etc.

The counter ions for positively charged organic emitter molecules can—in a preferred embodiment—perform the function of an additive. Examples are $Br^-$, $J^-$, $(AsF_6)^-$, $(SbF_6)^-$, singly negatively charged hexa-phenylarsenate, singly negatively charged hexa-phenylantimonate. The counter ions for negatively charged organic emitter molecules can be e.g. $Rb^+$, $Cs^+$ and/or $Ba^+$.

Figure 11:
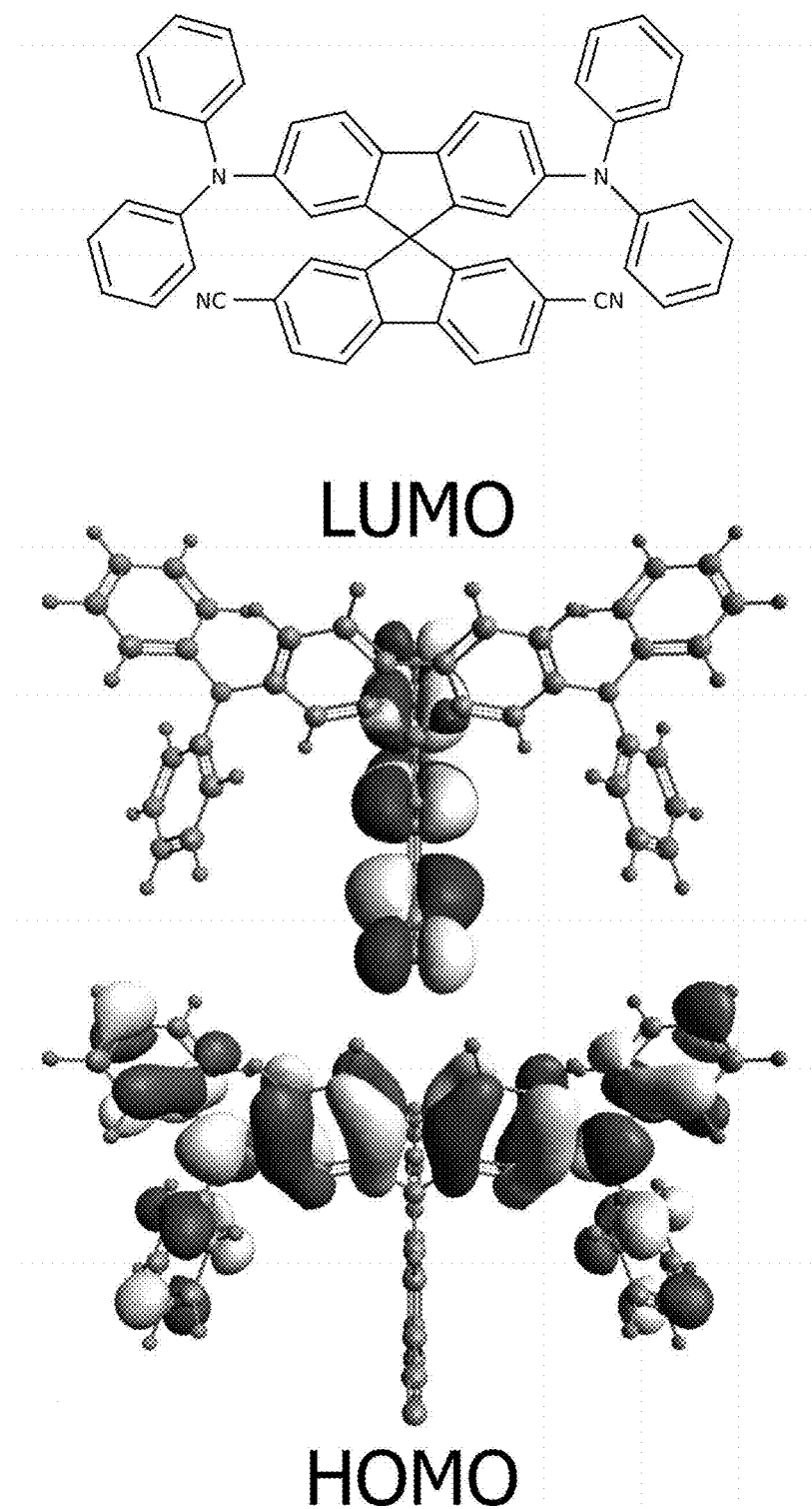
FIG. 11 shows a chemical structure of a spiro compound as an example of formula V as well as highest occupied molecular orbital (HOMO) and lowest unoccupied molecular orbital (LUMO) contour depictions according to an embodiment of the present invention.

In FIG. 11, the HOMO and LUMO contour depictions are determined by DFT calculations. The later show that a distinct charge transfer takes place at a electronic HOMO-LUMO transition and a small ΔE(S1–T1) value is to be expected as a result.

Figure 12:
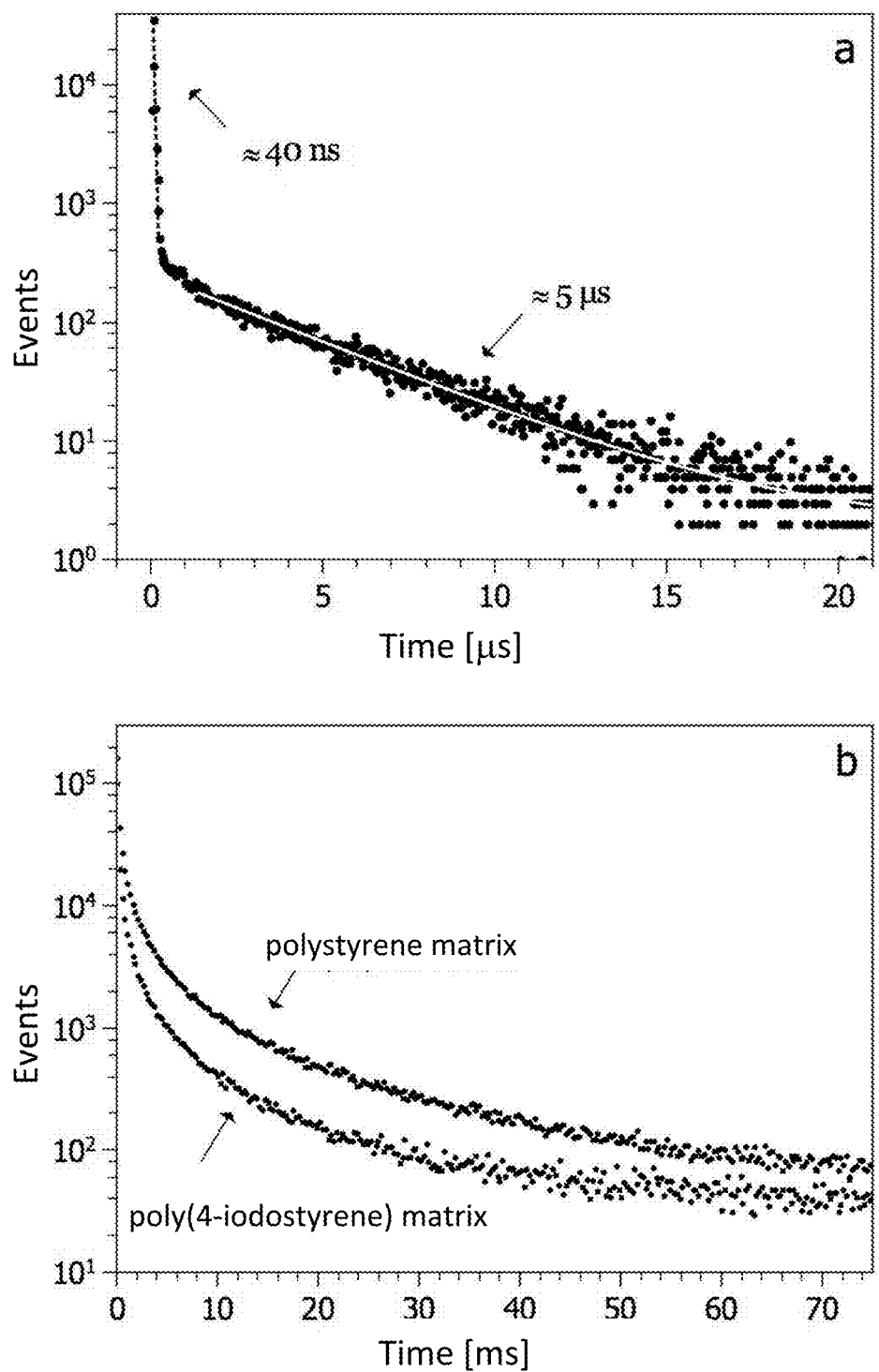
FIG. 12 shows emission decay curves at T=300 K for the spiro compound shown in FIG. 11.

In FIG. 12, the excitation of the emission was carried out with a laser pulse with a pulse width of 70 ps at 378 nm. The samples were degassed, to remove the atmospheric oxygen. (a) Emitter molecule dissolved in (fluid) toluene (c≈10-5 mol/l). The measurement clearly shows that two decay components occur. The short-lived component of ≈40 ns corre-sponds to a spontaneous fluorescence, whereas the long-lived component of ≈5 μs is assigned to the thermally activated delayed fluorescence. The later can be confirmed by the fact, that both emission components do not appear spectrally separated, but lie in the position of the spontaneous fluorescence with the maximum at about 500 nm. At room temperature, no phosphorescence was observed. In contrast, at low temperature (e.g. at T=10 K) phosphorescence can be well verified. The corresponding decay time lies within seconds. From the energy difference between the emission maximum of the phosphores-cence and the fluorescence spectrum (e.g. at T=10 K) the ΔE(S1–T1) value can be esti-mated to about 800 cm-1. (b) emission decay behavior of the spiro compound solved in a polystyrene matrix (=poly(l-phenylethane-1,2-diyl)) or in a poly(4-iodostyrene)-matrix (more exactly: poly(l-(4-iodophenyl)ethane-1,2-diyl) with a concentration of c≈1% by weight. The decay time of the thermally activated fluorescence is longer for these matrices than in (a) because the emitter is in a fixed matrix environment. The decay of the emission is expressed only for a relatively long millisecond period here, i.e. for a period, in which the thermally activated fluorescence occurs but no spontaneous fluorescence. The iodination of the matrix (increase of the external spin-orbit coupling) leads to a distinct increase of the intersystem crossing rate and thereby to a significant reduction of the emission lifetime of the thermally activated component. Thus, when using an additive (io-dinated matrix), this organic emitter substance (spiro compound) represents a combina-tion that is suitable for the singlet harvesting process.

Figure 13:
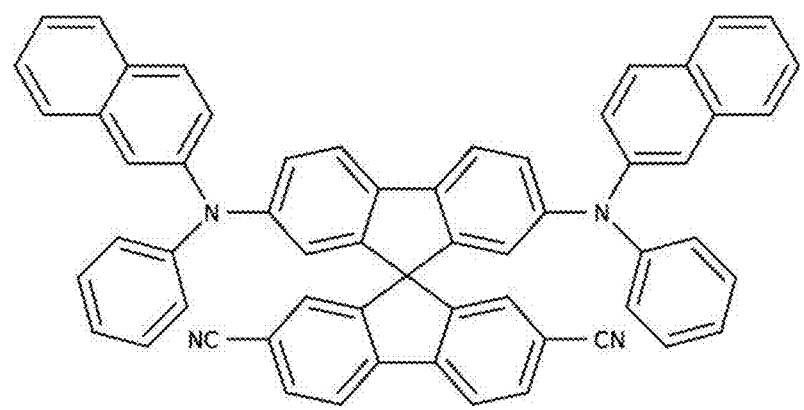
FIG. 13 shows chemical structures of spiro compounds according to embodiments of the present invention.
Figure 13:
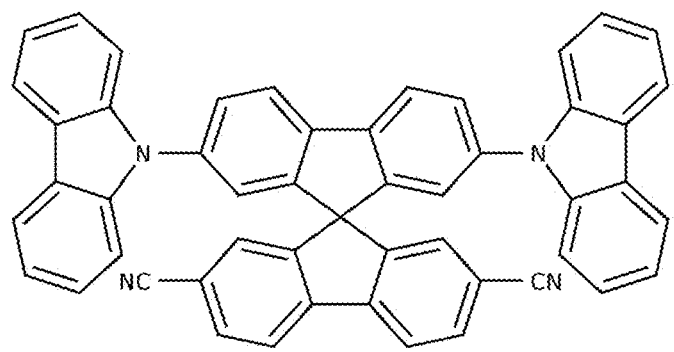
Figure 13:
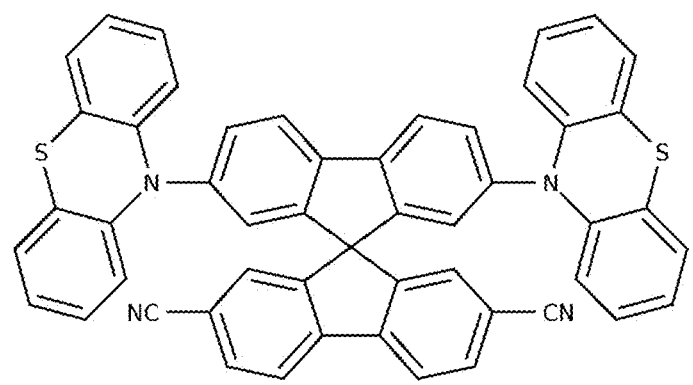

In FIG. 13, the upper compound shows at room temperature and doped in PMMA with c≈1% by weight a spontaneous and a thermally activated fluorescence with an emission maximum at ≈530 nm. The emission quantum yield of both components is (50±10) %. The compounds with the structural formulas shown below it also show thermally activated fluorescence.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

The invention claimed is:

1. A composition comprising:
an organic emitter molecule for emission of light, comprising a $\Delta E(S_1-T_1)$ value between a lowest excited singlet state $(S_1)$ and a triplet state $(T_1)$ below the lowest excited singlet state of less than 3000 cm$^{-1}$; and
an optically inert atom or a molecule;
wherein the optically inert atom or molecule interacts with the organic emitter molecule to reduce an intersystem crossing time constant of the organic emitter molecule to less than 300 ms,
wherein the organic emitter molecule is a molecule of formula V:

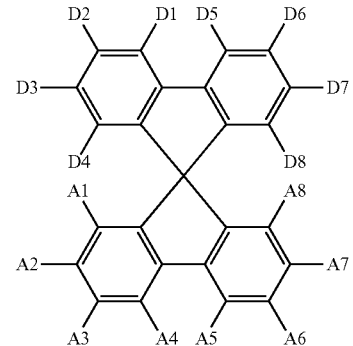

Formula V wherein
at least one of D1 to D8 is hydrogen or represents a donor group, each independently selected from the group consisting of: —O(—), —NH-alkyl group, —N-(alkyl group)$_2$, —NH$_2$, —OH, —O-alkyl group, —NH(CO) alkyl group, —O(CO), -alkyl group, -aryl group, -heterocyclic groups —(CH)=C-(alkyl group)$_2$, -phenoxazinyl, -phenothiazinyl, -carbazolyl, -dihydrophenazinyl, —N(R')(R") wherein R' and R" are H, alkyl, aryl, halogenated alkyl, halogenated aryl), wherein all aryl and heterocyclic groups can be substituted with alkyl and/or aryl groups, and all alkyl groups can also be substituted with F, Cl, Br and/or I;

wherein adjacent Di, Dj, and Dk from D1 to D8 optionally are conjugated aromatic or heteroaromatic rings, which may have a donor function, wherein i, j and k are each an integer from 1 to 8 and different from each other;

at least one of A1 to A8 is hydrogen or represents an acceptor group, each independently selected the group consisting of -halogen, —(CO)H, —(CO)-alkyl group, —(CO)O-alkyl group, —(CO)OH, —(CO)Cl, —$CF_3$, —$BF_2$, —CN, —$S(O)_2OH$, —$S(O)_2O$-alkyl, —$NH_3^+$, —N(alkyl group)$_3^+$, —$NO_2$, halogenated alkyl, and —B(R')(R'') wherein R' and R'' are H, alkyl, aryl, halogenated alkyl, halogenated aryl;

wherein adjacent Ai, Aj, and Ak from A1 to A8 optionally are conjugated aromatic or heteroaromatic rings, which may have an acceptor function, wherein i, j and k are each an integer from 1 to 8 and different from each other;

at least one donor group and at least one acceptor group are present;

wherein the optically inert atom or molecule is selected from the group consisting of krypton, xenon, bromine-comprising substances, iodine-comprising substances, metal atoms, metal nanoparticles, metal ions, gadolinium-complexes and lead complexes, and further wherein the organic emitter molecule is embedded into a matrix or cross-linked with a matrix and wherein the matrix comprises at least one covalently bonded additive selected from a bromine atom or an iodine atom.

2. The composition according to claim 1, wherein the optically inert atom or molecule comprises a spin-orbit coupling constant of greater than 1000 $cm^{-1}$.

3. The composition according to claim 1, wherein the ratio between the organic emitter molecule and the optically inert atom or molecule in the composition is in the range of 1:0.1 to 1:10.

4. The composition according to claim 1, wherein the organic emitter molecule has at a temperature T=300 K, an emission decay time of less than 500 ms and an emission quantum yield of at least 30%.

5. The composition according to claim 1, wherein the matrix comprises at least one deuterium atom.

6. The composition according to claim 1, wherein the matrix is a polymer matrix or a polymer cross-linked matrix, and the matrix is covalently linked with the organic emitter molecule.

7. The composition of claim 1, wherein the matrix comprises one of glucose, trehalose or a combination thereof.

8. The composition of claim 1, wherein the composition is used in an emitter layer of an optoelectronic device.

* * * * *